(12) United States Patent
Achenbach et al.

(10) Patent No.: US 7,164,234 B2
(45) Date of Patent: Jan. 16, 2007

(54) HIGH-POWER MICROWAVE SYSTEM EMPLOYING A PHASE-LOCKED ARRAY OF INEXPENSIVE COMMERCIAL MAGNETRONS

(75) Inventors: Robert Parker Achenbach, Albuquerque, NM (US); Albert Lerma, Albuquerque, NM (US)

(73) Assignee: L-3 Communications Corporation, New York, NY (US)

( * ) Notice: Subject to any disclaimer, the term of this patent is extended or adjusted under 35 U.S.C. 154(b) by 113 days.

(21) Appl. No.: 11/083,850

(22) Filed: Mar. 18, 2005

(65) Prior Publication Data
US 2006/0208672 A1    Sep. 21, 2006

(51) Int. Cl.
*H01J 25/50* (2006.01)
(52) U.S. Cl. .................. 315/39.51; 315/39.75; 315/39.77; 315/39.53; 315/39.69; 315/39.3; 331/91
(58) Field of Classification Search ............. 315/39.75, 315/39.51, 39.77, 39.69, 39.3; 331/86, 91
See application file for complete search history.

(56) References Cited

U.S. PATENT DOCUMENTS

| | | | |
|---|---|---|---|
| 4,571,552 A * | 2/1986 | Brown .................. | 330/47 |
| 4,634,992 A | 1/1987 | Brown .................. | 330/47 |
| 5,084,651 A * | 1/1992 | Farney ................ | 315/39.51 |
| 5,162,698 A | 11/1992 | Kato et al. ............ | 315/39 |
| 6,614,010 B1 * | 9/2003 | Fagrell et al. .......... | 219/690 |

OTHER PUBLICATIONS

R.Adler, "A Study of Locking Phenomena in Oscillators", PROC IRE, vol. 34, p.m. 351-357, Jun. 1946.

* cited by examiner

*Primary Examiner*—Hoang V. Nguyen
*Assistant Examiner*—Chuc Tran
(74) *Attorney, Agent, or Firm*—Fitch, Even, Tabin & Flannery

(57) ABSTRACT

A high-power microwave generator employing a plurality of inexpensive commercial magnetron tubes cross-coupled by means of a secondary coupling path between each magnetron output pair, whereby a portion of the output energy from a first magnetron tube is injected into a second magnetron tube and a portion of the output energy from the second magnetron tube is similarly injected into the first magnetron tube. The resulting cross-injection of microwave energies brings the respective magnetron tube pair into a phase-lock sufficiently stable to permit coherent combination of their outputs for many high-power microwave applications, such as directed energy weapon systems. The magnetron phase-locking system requires no external components other than the secondary coupling paths of this invention.

22 Claims, 6 Drawing Sheets

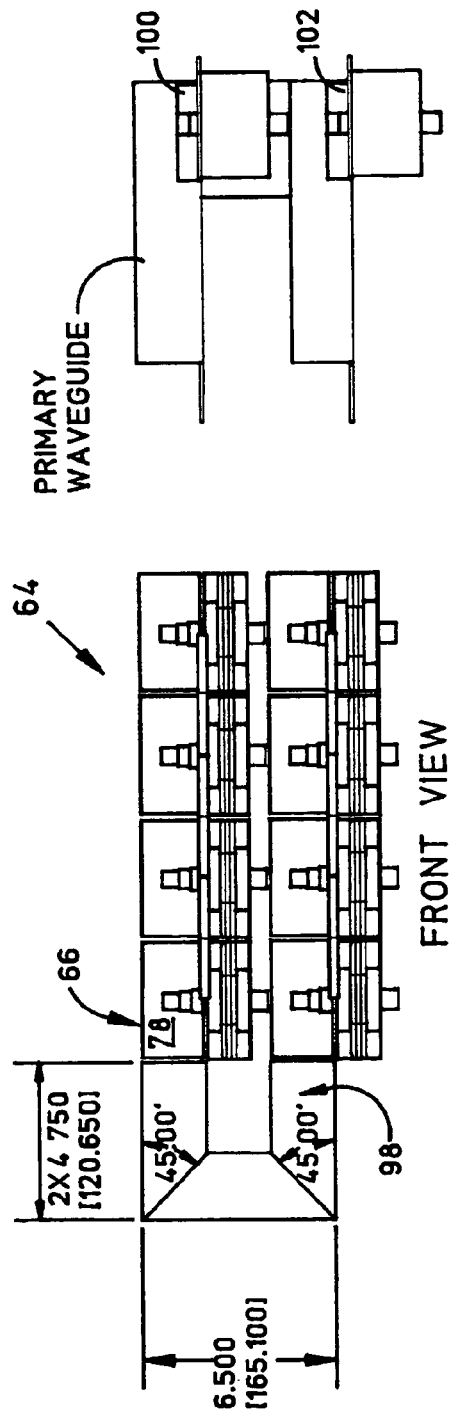
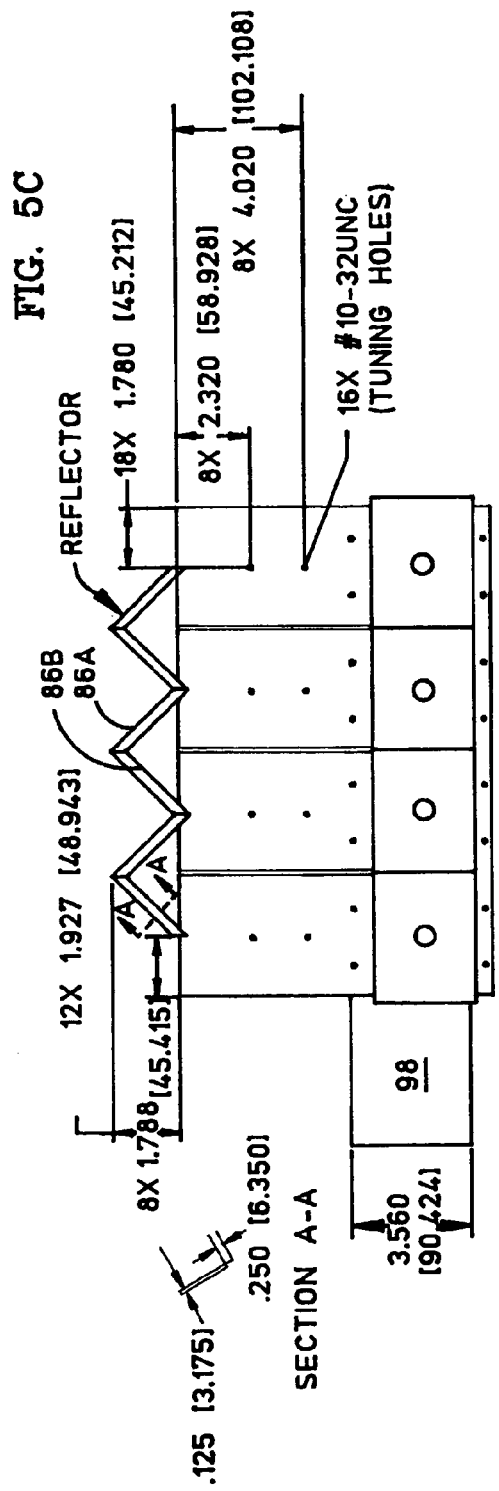

HIGH-POWER MICROWAVE SYSTEM EMPLOYING A PHASE-LOCKED ARRAY OF INEXPENSIVE COMMERCIAL MAGNETRONS

BACKGROUND OF THE INVENTION

1. Field of the Invention

This invention relates generally to high-power microwave generators and more particularly to high-power microwave systems employing a phase-locked array of inexpensive commercial magnetrons.

2. Description of the Related Art

The conventional magnetron (herein also denominated "magnetron tube") is a well-known and very efficient device used to convert stored electrical energy into microwave-frequency alternating currents. Magnetron operating principles have been known since at least 1921 and magnetrons have been used in extensively in microwave radars since the first pulsed resonant cavity magnetron (3 GHz) was developed by the British in 1940. Today, inexpensive mass-produced magnetrons (herein also denominated "commercial magnetrons") can be found in every home possessing a microwave oven.

A typical single-body magnetron tube known in the art is a coaxial vacuum device consisting essentially of an external cylindrical anode (which attracts electrons) and an internal, coaxial cylindrical cathode (which emits electrons). In a typical design, the anode is grooved to form resonator cavities disposed to form a symmetric series of vanes. In operation, an electric potential ("anode voltage") is placed across the evacuated annulus formed between the anode and cathode. Simultaneously, a constant axial magnetic field is created in the evacuated annulus that serves to cause electrons emitted by the cathode responsive to the anode voltage to travel around the cathode in paths that are 'influenced' by RF fields in the anode resonant cavities. With appropriate conditions, electrons following these paths form rotating 'spokes' of space charge that interact with the anode resonator fields in such a way as to induce displacement currents in each resonator cavity. As a spoke of electrons approaches an anode vane, it induces a positive charge in that vane. As the electron spoke passes, the positive charge diminishes in the first vane while another positive charge is being induced in the next vane. The physical structure of the anode forms the equivalent of a series of high-Q resonant inductive-capacitive (LC) circuits. The vanes are alternately strapped together to effectively connect the LC circuits in parallel. The induced displacement currents of each resonator are coupled to a tuned output cavity by any of various means, and from there are coupled to a primary output waveguide that conducts the microwave energy into an energy absorbing or transmitting load. The number and shape of the resonator cavities and the dimensions of the anode and cathode are most often selected by the designer based on scaled values from previous magnetron designs that are, in turn, selected for their appropriateness for the given application. Design features that might cause one type of resonator configuration to be preferable over another type include operating characteristics such as the "pushing factor," which denominates a measure of the output frequency variation arising from anode voltage fluctuations, and the "pulling factor," which denominates a measure of the output frequency variation arising from changes in RF load impedance. Clearly, as is well-known in the art, the magnetron tube is a complex resonant 'system' for energy conversion whose precise operating parameters, for example frequency and efficiency, depends on many different design and load factors and may accordingly be somewhat intractable.

It is also well-known in the art that the output energy from a magnetron can be 'locked' in frequency and phase to that of an externally-applied signal that is properly 'injected' into the magnetron's resonant structure with an appropriate amplitude within a limited 'locking range' of frequencies. The basic equation that describes this injection-lock behavior for small injection magnitudes was derived by Adler (R. Adler, "A Study of Locking Phenomena in Oscillators," *Proc. IRE*, Vol. 34, pp. 351–357, June 1946):

$$\frac{\Delta \omega_L}{(\omega_o / 2Q)} = \frac{V_L}{V_o} \sin\alpha \qquad [\text{Eqn. 1}]$$

where $\Delta\omega_L$ is half of the maximum locking range, $\omega_o$ is the 'natural' frequency of the oscillator, Q is the quality factor of resonant circuit of the oscillator, $V_L$ is the injection input level, $V_o$ is the oscillator output level, and a is the steady-state phase difference between the injected signal and the output signal.

A single magnetron tube operating continuously is presently subject to practical output power limits of about 1 MW, which can be attained only with a very large and expensive device supported by large and expensive external cooling systems. In principle, Eqn. 1 above teaches that larger microwave energy outputs suitable for applications such as radar, power transmission and directed energy weapons, can be obtained by means of the coherent combination of synchronous output energies from a plurality of magnetron tubes. Moreover, in principle, for any particular system output power, the system cost, size, and reliability can be improved significantly by phase-locking many smaller magnetrons. In view of these conceptual advantages, early practitioners in the art attempted to achieve higher system output power by phase-locking a plurality of separate magnetron tubes. For example, several early efforts were made to achieve injection phase-locking of several distinct or separate magnetron tubes with a common master input signal with varying levels of success. Another early effort was made to achieve bootstrap phase-locking of several distinct magnetron tubes arranged in a hexagonal array with pair-wise waveguide connections between them, by energizing them simultaneously without benefit of a common master input signal. The phase-locking effect of such pair-wise waveguide communication between hexagonally-arrayed magnetron tubes was found to be achievable only at the expense of dedicating an evacuated port between each adjacent pair of individual magnetrons. Neither approach is presently considered in the art as a useful solution to the magnetron tube phase-locking problem.

FIG. 1 illustrates an exemplary solution to the dual magnetron phase-locking problem from the prior art, showing a dual phase-locked magnetron system 10, including a separate drive signal source 12, the two magnetron tubes 14–16 each having a respective output 18–20, and the respective three-port power circulators 22–24 each disposed to couple output power from the respective magnetron tube output 18–20 to the respective primary coupling path 26–28 from which the resulting microwave energy is coupled to free space (not shown). Power from drive signal source 12 is introduced at the port 30 and respective portions of the respective magnetron tube output powers are introduced at the ports 32–34 for distribution to circulators 22–24, from which the respective energies are injected into the respective magnetron tube outputs 18–20 to "pull" the respective magnetron tubes 14–16 into phase-lock with drive signal source 12. Circulators 22–24 and drive signal source 12 represent a substantial weight, volume, cost, and complexity burden for dual phase-locked magnetron system 10; so substantial that a single magnetron tube having twice the individual power rating of magnetron tubes 14–16 may represent a more cost-effective embodiment for system 10. Moreover, the power losses in power circulators 22–24 are also a significant burden in some applications.

FIG. 2 illustrates a well-known injection magnetron phase-locking method from the prior art. A three-port high-power circulator 36 is coupled to the output cavity (not shown) of the magnetron tube 38 by way of the primary coupling path 40. An injection signal generator 42 produces an injection signal $f_i$ and couples it to the second circulator port 44, where it is injected into primary coupling path 40 to "pull" the magnetron tube output signal $f_o$ into phase-lock with injection signal $f_i$. Output signal $f_o$ at circulator 36 is coupled to the load 46 by the third circulator port 48. Circulator 36 must be fabricated to handle the primary output power from magnetron tube 38 and is generally disadvantageously inefficient. For effective phase-locking, the requisite level of injection signal $f_i$ depends on the spectral bandwidth (also known as the quality factor 'Q') of magnetron tube 38 as defined by Adler in the reference cited above in connection with Eqn. 1. This technique is expensive but it permits the precise control of the somewhat unruly magnetron tube output signal $f_o$ by injection signal $f_i$ from injection signal generator 42, which may be as precise and stable as desired.

FIG. 3 illustrates a well-known phase-locked loop (PLL) magnetron phase-locking method from the prior art. The magnetron tube output signal $f_o$ from the output cavity (not shown) of the magnetron tube 50 is coupled by the primary coupling path 52 through a loop coupler 54 to the load 56. A reference signal generator 58 provides a reference signal $f_r$ to a phase detector 60, which also accepts a sample of magnetron tube output signal $f_o$ from loop detector 54. Phase detector 60 compares reference signal $f_r$ and magnetron tube output signal $f_o$ to produce an error signal $f_e$, which is coupled to the anode current control element 62 for magnetron tube 50. Loop coupler 54, anode current control element 62 and phase detector 60 operate as a PLL circuit in the well-known manner. With the proper loop stability, adjusting the anode current to magnetron tube 50 responsive to error signal $f_e$ soon brings magnetron tube output signal $f_o$ into phase-lock with reference signal $f_r$. This technique is also expensive but it permits the precise control of the somewhat unruly magnetron tube output signal $f_o$ by reference signal $f_r$ from reference signal generator 58, which may be as precise and stable as desired and this method may avoid some of the power losses noted in circulator 36 of FIG. 2.

Other practitioners in the art have more recently proposed solutions to the magnetron array phase-locking problem. For example, in U.S. Pat. No. 4,571,552, Brown discloses a technique for phase locking a magnetron output signal with a frequency source signal that is obtained by comparing the output signal phase to a source signal phase to obtain an error signal that is applied to a winding of the magnetron magnet to thereby change the flux applied to the magnetron tube, while the magnetron output signal frequency is also "pulled" by the source signal injected into the magnetron tube by way of a three-port circulator. Brown's technique requires an additional magnet winding, external error detection circuitry, and an external three-port high-power circulator; all additional to the magnetron tubes themselves.

In U.S. Pat. No. 4,634,992, Brown discloses an alternative technique for combining the high output power of two magnetron tube amplifiers using a novel ("Magic T") microwave circuit to reduce the power dissipated by a low-power ferrite circulator connected between the input signal source and the Magic T circuit. Brown is obliged to add external phase and amplitude comparators to control the magnetron tube outputs so that they may be coherently combined in the Magic T circuit. Brown's alternative technique also requires significant additional components, including an additional Magic T circuit, external phase and amplitude error detection and correction circuitry and an external three-port low-power circulator; all additional to the magnetron tubes themselves.

With a different approach, in U.S. Pat. No. 5,162,698, Kato et al. disclose a cascaded magnetron device having a series of tubular anode elements placed end to end in a linear cascade extending along at least part of an elongate cathode shank. Each adjacent pair of anode elements is separated by a conductive, annular pin-down disc, and the cathode shank has a series of spaced bands of field-emitting material separated by non-emitting regions, each band being located within a respective one of the anode elements and spaced inwardly from the ends of that element. Suitable power inputs and magnetic field generators are provided for producing electron emission and oscillation in the interaction zone between each emitting band and the respective anode element surrounding that band, and suitable extraction devices are provided for extracting power from each of the interaction zones, thereby phase-locking the cascaded magnetron bodies. In effect, Kato et al. propose a single device having a plurality of magnetron tube cavities disposed in a fixed coaxial relationship, which neither resolves nor even considers the problem of coupling a plurality of separate commercial magnetron tubes for effective high power operation.

These magnetron tube phase-locking efforts were motivated primarily by the high power requirements of, e.g., radar transmitters, particle accelerators and space-power-generators, where precise phase, power, and frequency control is imperative. For example, electron accelerators require microwave power supplies having phase stability within 0.1 to 0.2 degrees of nominal. A secondary motivation for these efforts is the universal availability of inexpensive commercial magnetron tubes. Finally, magnetron tubes are generally preferred because even a relatively expensive high-power magnetron tube can be manufactured for less than half the cost per kilowatt of, for example, a klystron. Available solutions to the magnetron phase-locking problem, such as the external phase-control circuitry described in the two Brown patents (U.S. Pat. Nos. 4,634,992 and 4,634,992), all introduce unwelcome burdens of complexity and cost into any microwave system employing a plurality of separate magnetron tubes. Although such solutions may succeed in stabilizing frequency, phase, and power output from a plurality of phase-locked magnetron tubes, the attendant burdens are disadvantageous for many microwave power applications (such as directed energy weapons) that may be more tolerant of small variations in output phase, power and frequency.

There is accordingly a clearly-felt need in the art for an efficient and inexpensive means for phase-locking a plurality of simple and inexpensive commercial magnetron tubes to permit the coherent combining of the resulting plurality of energy outputs. These unresolved problems and deficiencies are clearly felt in the art and are solved by this invention in the manner described below.

SUMMARY OF THE INVENTION

This invention solves these problems by adding, for the first time, a secondary coupling path between each of a plurality of magnetron tube output pairs whereby a portion of the output energy from a first magnetron tube is injected into a second magnetron tube and a portion of the output energy from the second magnetron tube is similarly injected into the first magnetron tube. The resulting pair-wise cross-injection of microwave energies brings each respective magnetron tube pair into a phase-locked operating condition sufficiently stable to permit coherent combination of the output energies for many high-power microwave applications, such as directed energy weapon systems. The magnetron tube cross-coupling phase-locking system of this invention for the first time facilitates the coherent combination of a plurality of inexpensive commercial magnetron tubes without expensive external components.

It is a purpose of this invention to provide an efficient and inexpensive means for phase-locking the energy outputs of a plurality of simple and inexpensive mass-produced magnetron tubes for coherent combination.

In one aspect, the invention is a microwave power generator system employing a plurality of magnetron tubes, each having an anode coupled to an output cavity and a primary coupling waveguide disposed to transfer microwave energy from the magnetron output cavity to free space to produce a radiated microwave field, and a secondary cross-coupler disposed to redirect a portion of the microwave energy from a first magnetron tube output cavity into a second magnetron tube output cavity and to redirect a portion of the microwave energy from the second magnetron tube output cavity into the first magnetron tube output cavity.

In another aspect, the invention is a directed energy weapon system for projecting microwave energy along a predetermined path employing a plurality of magnetron tubes, each having an anode coupled to an output cavity and a primary coupling waveguide disposed to transfer microwave energy from the magnetron output cavity to free space to produce a radiated microwave field, a secondary cross-coupler disposed to redirect a portion of the microwave energy from a first magnetron tube output cavity into a second magnetron tube output cavity and to redirect a portion of the microwave energy from the second magnetron tube output cavity into the first magnetron tube output cavity, and a microwave reflector for redirecting the radiated microwave field along the predetermined path.

In one embodiment, the invention is microwave power generator system employing a plurality of magnetron tubes, each having an anode coupled to an output cavity and a primary coupling waveguide disposed to transfer microwave energy from the magnetron output cavity to free space to produce a radiated microwave field, wherein the magnetron tube plurality is disposed in an array having a plurality of columns and a plurality of rows, and a secondary row cross-coupler disposed between a first and a second magnetron tube within a single array column to redirect a portion of the microwave energy from the first magnetron tube output cavity into the second magnetron tube output cavity and to redirect a portion of the microwave energy from the second magnetron tube output cavity into the first magnetron tube output cavity.

The foregoing, together with other objects, features and advantages of this invention, can be better appreciated with reference to the following specification, claims and the accompanying drawing.

BRIEF DESCRIPTION OF THE DRAWINGS

For a more complete understanding of this invention, reference is now made to the following detailed description of the embodiments as illustrated in the accompanying drawing, in which like reference designations represent like features throughout the several views and wherein:

FIGS. 5A–C are front, bottom and right side scaled views of the phase-locked magnetron array embodiment from FIG. 4;

DETAILED DESCRIPTION OF THE EMBODIMENTS

Figure 4:
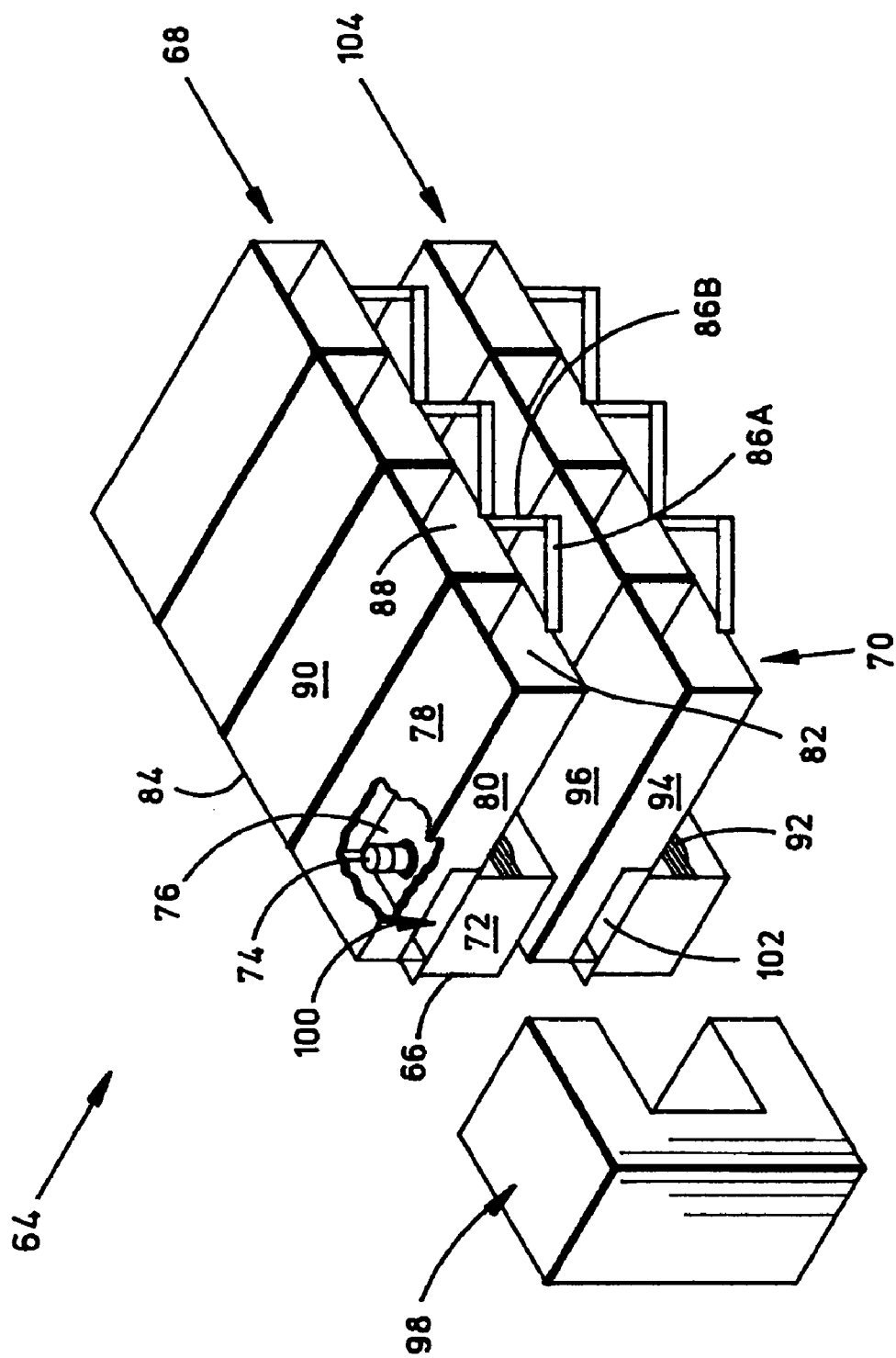
FIG. 4 is an perspective view of a first illustrative embodiment of the phase-locked magnetron array of this invention having eight magnetron tubes disposed in a two-dimensional array, including an exploded view of one of the secondary coupling paths and a cutaway view of a magnetron tube output.

FIG. 4 is a perspective view of an illustrative phase-locked magnetron array embodiment 64 of this invention having eight magnetron tubes, exemplified by the magnetron tube 66, disposed in a two-dimensional array, with rows exemplified by the row 68 that includes magnetron tube 66, and columns exemplified by the column 70 that includes magnetron tube 66. Each magnetron tube may be appreciated with reference to the following description of magnetron tube 66, which includes a body 72, an output antenna 74 extending into an output cavity 76, which is coupled to a primary coupling waveguide 78, having a sidewall 80. The microwave energy produced at anode antenna 74 is coupled from output cavity 76 and radiated into free space at the primary aperture 82 of primary coupling waveguide 78 to create a radiated microwave field in the usual manner.

The operation of any horizontally-adjacent pair of magnetron tubes can be appreciated with reference to the following discussion of the horizontally-adjacent pair of magnetron tubes 66 and 84, which are provided with the secondary cross-coupler 86 incorporating the two reflective elements 86A–B. Reflective element 86A is disposed in the microwave field radiated from primary aperture 82 to redirect a portion of the microwave energy radiated from primary aperture 82 (from output cavity 76 of magnetron tube 66) into the primary aperture 88 and therefrom into the output cavity (not shown) of horizontally-adjacent magnetron tube 84. Symmetrically, reflective element 86B is disposed in the microwave field radiated from primary aperture 88 to redirect a portion of the microwave energy radiated from primary aperture 88 (from the output cavity of magnetron tube 84) into primary aperture 82, from where the energy portion is guided into output cavity 76 of horizontally-adjacent magnetron tube 66. Accordingly, reflective elements 86A-B of secondary cross-coupler 86 operate to redirect a portion of the microwave energy from the output cavity of each of two horizontally-adjacent magnetron tubes into the output cavity of the other respective horizontally-adjacent magnetron tube. By using symmetric disposition of the other reflective elements with respect to the other horizontally-adjacent pairs of magnetron tubes, every other magnetron tube in row 68 is then similarly phase-locked to adjacent magnetron tubes as are 66 and 84. The precise dimensions and disposition of reflective elements 86A–B (see the description of FIG. 5 below) in combination with the length of waveguides 78 and 90 and any internal waveguide 'tuning' elements (e.g. screws, not shown) should be chosen to produce the desired degree of phase-lock for the horizontal pair of magnetron tubes 66 and 84.

The operation of vertically-adjacent phase-locked rows of magnetron tubes can be appreciated with reference to the following discussion of the vertically-adjacent pair of magnetron tubes 66 and 92. Because magnetron tubes 66 and 92 are disposed at the end of their respective rows, the respective sidewalls 80 and 94 of their respective primary coupling waveguides 78 and 96 are exposed and accessible. Thus, magnetron tubes 66 and 92 may be phase-locked according to this invention by means of a secondary cross-coupling waveguide 98 as follows. Sidewalls 80 and 94 are provided with respective sidewall apertures 100 and 102 (embodied as, for example, waveguide irises) into the respective output cavity of magnetron tubes 66 and 92. Secondary cross-coupling waveguide 98, shown in exploded view, is disposed over sidewall apertures 100 and 102 to redirect a portion of the microwave energy radiated from sidewall aperture 100 (from output cavity 76 of magnetron tube 66) through sidewall aperture aperture 102 into the output cavity (not shown) of vertically-adjacent magnetron tube 92. Secondary cross-coupling waveguide 98 also redirects a portion of the microwave energy radiated from sidewall aperture 102 (from the output cavity of magnetron tube 92) through sidewall aperture aperture 100 into output cavity 76 of vertically-adjacent magnetron tube 66. Accordingly, secondary cross-coupling waveguide 98 operates to redirect a portion of the microwave energy from the output cavity of each of two vertically-adjacent magnetron tubes into the output cavity of the other vertically-adjacent magnetron tube. When every other magnetron tube in row 68 is phase-locked to magnetron tube 66 and every other magnetron tube in the row 104 is phase-locked to magnetron tube 84 in the manner discussed above, the phase-locking of the single vertically-adjacent magnetron tube pair 66 and 92 is sufficient to phase-lock all magnetron tubes in rows 68 and 104; that is, for the entire eight-element array 64. The precise dimensions, adjustment and disposition of sidewall apertures 66 and 102 (see the description of FIG. 5 below) should be chosen to produce the desired degree of phase-lock in the vertical pair of magnetron tubes 66 and 92.

FIGS. 5A–C are front, right side and bottom scaled views of the phase-locked magnetron array embodiment 64 of FIG. 4. FIG. 5B shows one example of the proper disposition of reflective elements 86A–B, which are oriented at about 42.8 degrees from the radiation axis with one end substantially horizontally centered within the respective 3.5625 inch primary coupling waveguide radiating aperture and extending away therefrom by about 1.927 inches, being otherwise disposed and dimensioned substantially as shown. For example, section A—A shows elements 86A–B as having an L-shaped cross-section with a 0.25 inch horizontal width and a 0.125 inch vertical lip. FIG. 5C shows an example of sidewall apertures 100 and 102, which may be embodied as adjustable microwave irises for convenient adjustment of aperture dimensions, for example. FIG. 5A shows an example of secondary cross-coupling waveguide 98, which is dimensioned and disposed substantially as shown. For example, secondary cross-coupling waveguide 98 is shown with substantially the same 3.56 inch width as shown for each for exemplary primary coupling waveguide 78 at magnetron tube 66.

According to this invention, reflective secondary coupling paths facilitate phase-locking between magnetrons within a single row and sidewall secondary coupling paths facilitate phase-locking between adjacent rows of magnetrons in a two-dimensional array of phase-locked magnetrons. The signal portions that couple between magnetron pairs along the secondary paths may be tuned for desired performance by adjusting aperture and reflector dimensions and by providing tuning screws (not shown) or the like in the primary-path so that signals of optimal amplitude and phase for inducing phase-locking are coupled between each magnetron. By means of the secondary coupling paths, each magnetron in array 64 drives adjacent magnetrons and is, in turn, driven by the same adjacent magnetrons. The net effect is that all magnetrons in the array behave as essentially identical parallel magnetrons. With the appropriate design and tuning, exemplified by the secondary coupling element dimensions and dispositions disclosed in FIG. 5, the eight separate radiated primary coupling path signals are thereby phase-locked to form an output plurality that coherently combines to form one high-power far-field microwave signal in free-space.

Figure 6A:
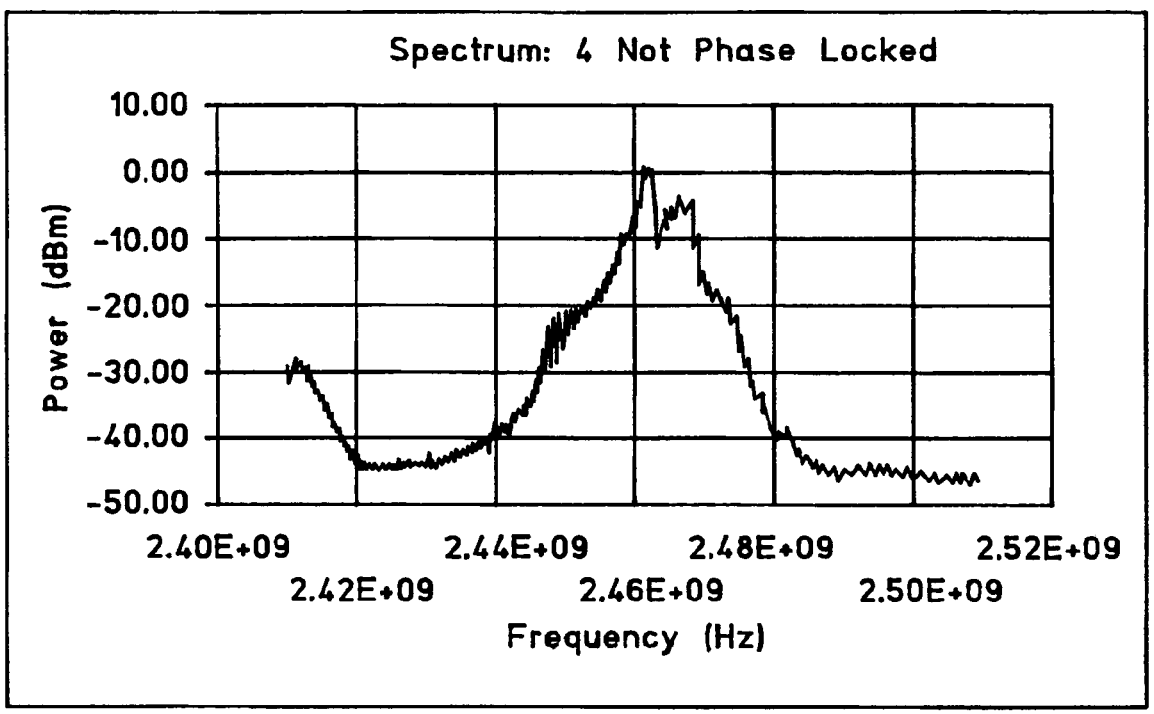
FIG. 6A is a chart illustrating measured spectral data representing the output signal from the waveguide outputs of a second illustrative phase-locked magnetron array embodiment having four magnetrons disposed in a one-dimensional array without the secondary coupling paths of this invention.
Figure 6B:
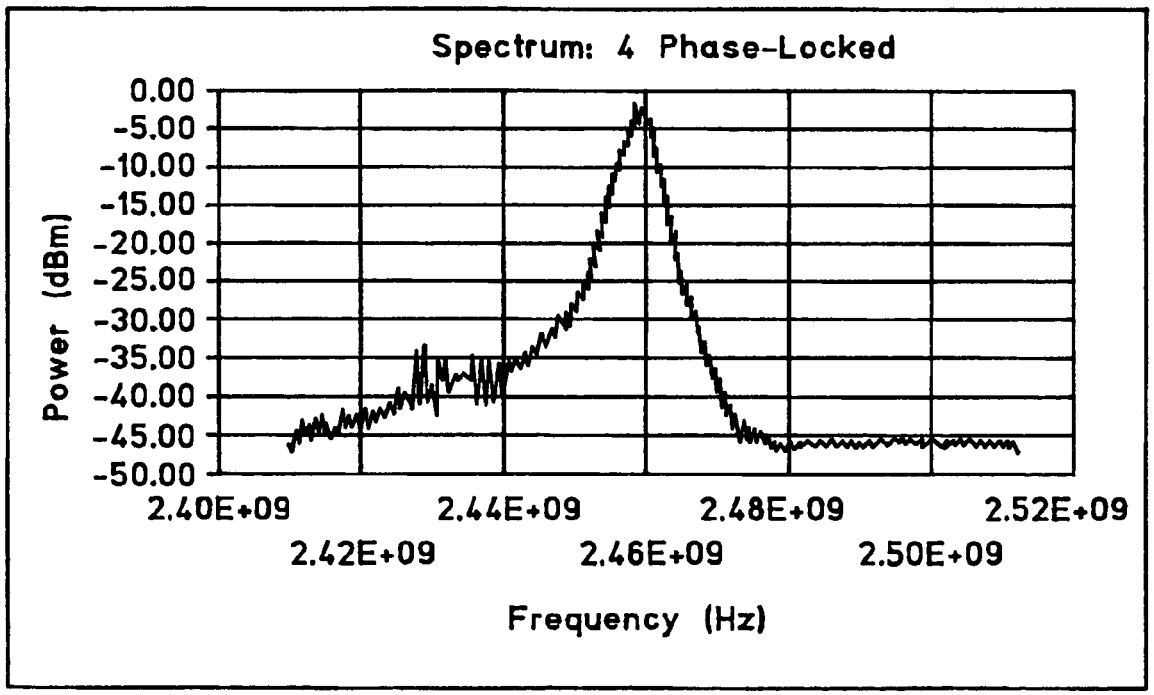
FIG. 6B is a chart illustrating measured spectral data representing the output signal from the waveguide outputs of the illustrative embodiment from FIG. 6A modified by the addition of the secondary coupling paths of this invention.

FIG. 6A is a chart illustrating measured spectral data representing the output signal (at 1.2 m range) from the waveguide outputs of a second illustrative phase-locked magnetron array embodiment having four magnetrons disposed in a one-dimensional array without the secondary coupling paths of this invention. Note that the spectral power is spread over a relatively wide band and significant multiple spectral components are apparent. FIG. 6B is a chart illustrating measured spectral data representing the output signal (at 1.2 m range) from the waveguide outputs of the same illustrative embodiment modified by adding the secondary coupling paths of this invention. Note that only one significant spectral component is apparent, demonstrating that the far-field spectral power is coherently combined within a relatively narrow frequency band. Thus, comparing FIGS. 6A–6B demonstrates the efficacy of the phase-locking system of this invention.

Figure 7A:
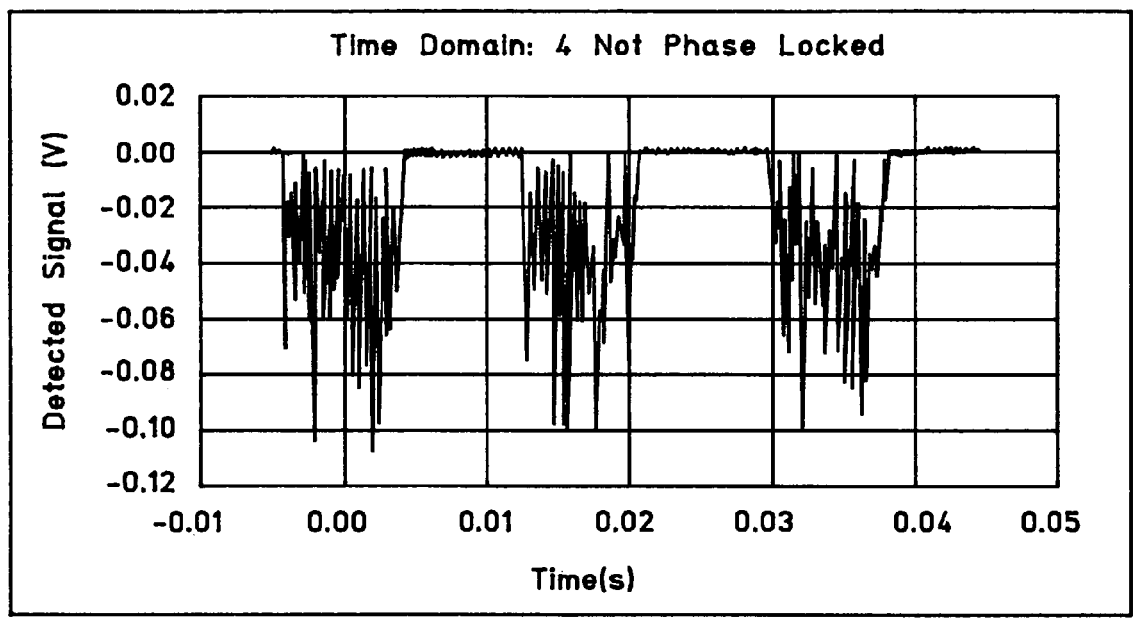
FIG. 7A is a chart illustrating measured temporal data representing the output signal from the waveguide outputs of the illustrative embodiment from FIG. 6A.
Figure 7B:
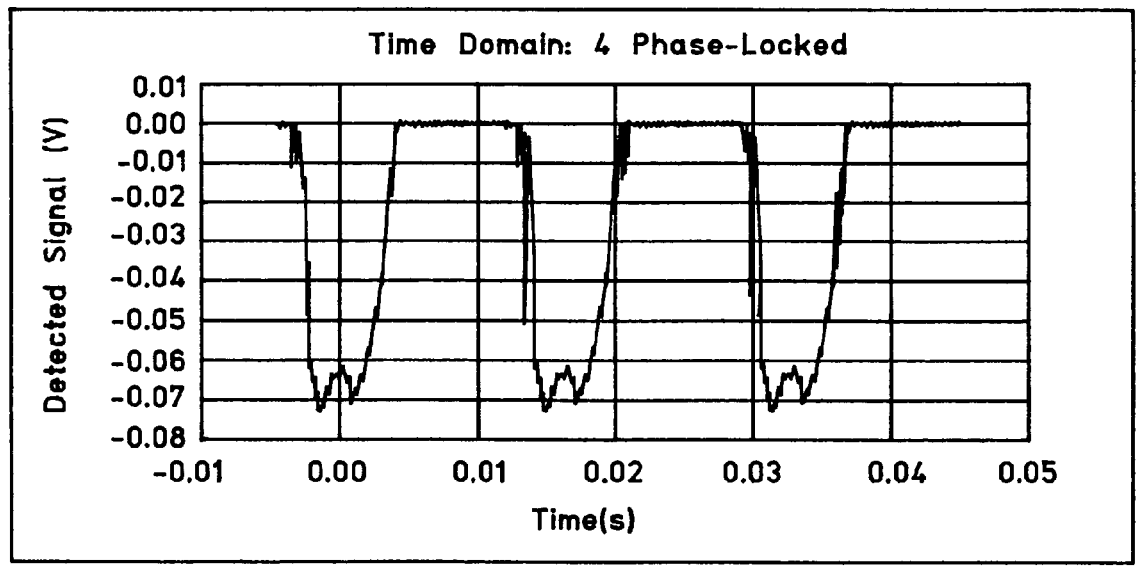
FIG. 7B is a chart illustrating measured temporal data representing the output signal from the waveguide outputs of the illustrative embodiment from FIG. 6A modified by the addition of the secondary coupling paths of this invention.

FIG. 7A is a chart illustrating measured temporal data representing the output signal (at 1.2 m range) from the waveguide outputs of the same illustrative phase-locked magnetron array embodiment having four magnetrons disposed in a one-dimensional array without the secondary coupling paths of this invention. Note that the signal level fluctuates widely within each pulse interval because of interference (the 'beat' effect) among the different radiated frequencies. FIG. 7B is a chart illustrating measured temporal data representing the output signal (at 1.2 m range) from the waveguide outputs of the illustrative embodiment from FIG. 6A modified by the addition of the secondary coupling paths of this invention. Note that the signal level is relatively stable within each pulse interval, demonstrating that the far-field spectral power is coherently combined (i.e. frequency-locked) within a relatively narrow frequency band. Thus, comparing FIGS. 7A–7B also demonstrates the efficacy of the phase-locking system of this invention.

Figure 1:
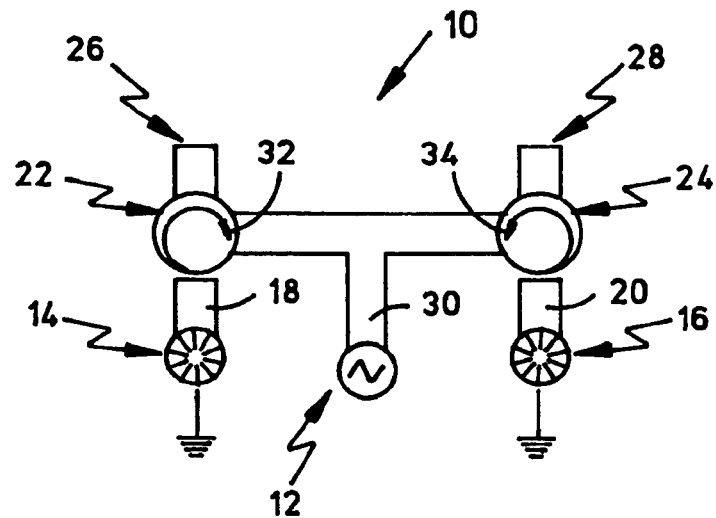
FIG. 1 is a block diagram illustrating an exemplary dual-magnetron circuit from the prior art.
Figure 2:
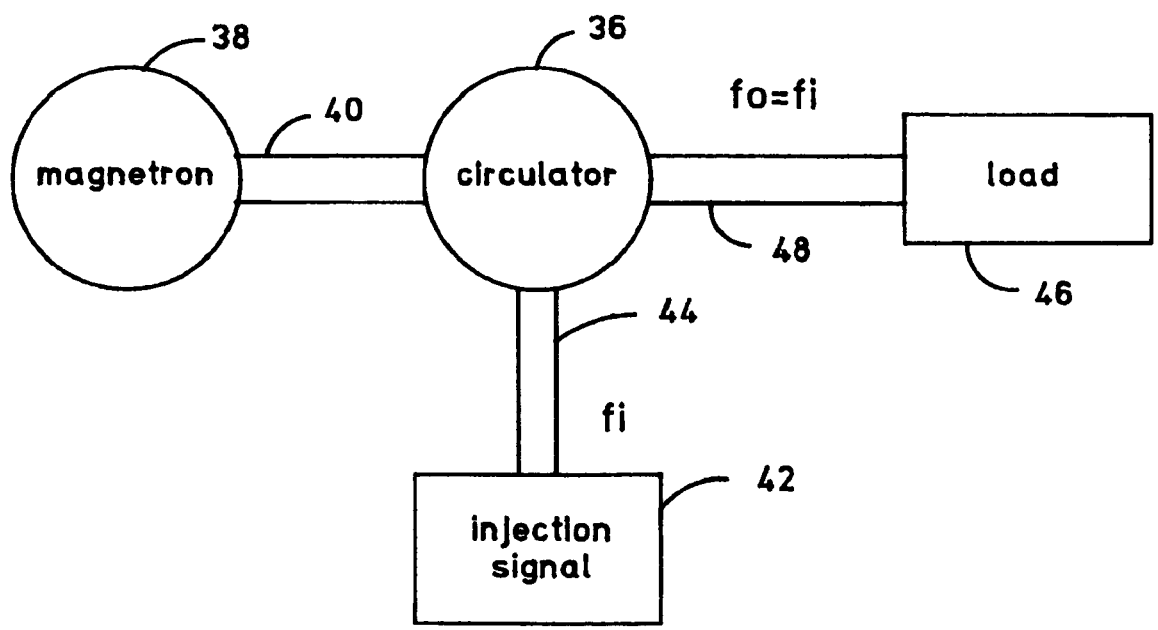
FIG. 2 is a block diagram illustrating a injection magnetron phase-locking method from the prior art.
Figure 3:
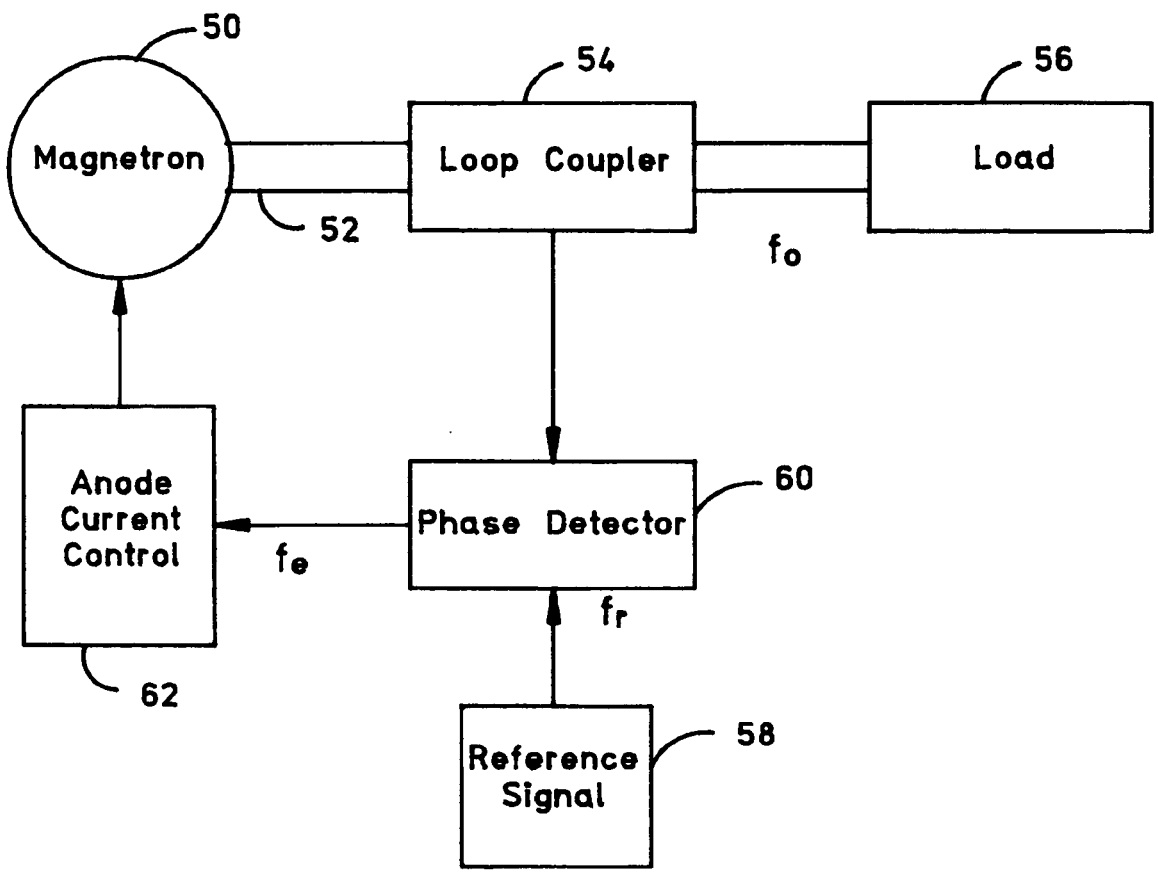
FIG. 3 is a block diagram illustrating a phase-locked loop (PLL) magnetron phase-locking method from the prior art.
Figure 8:
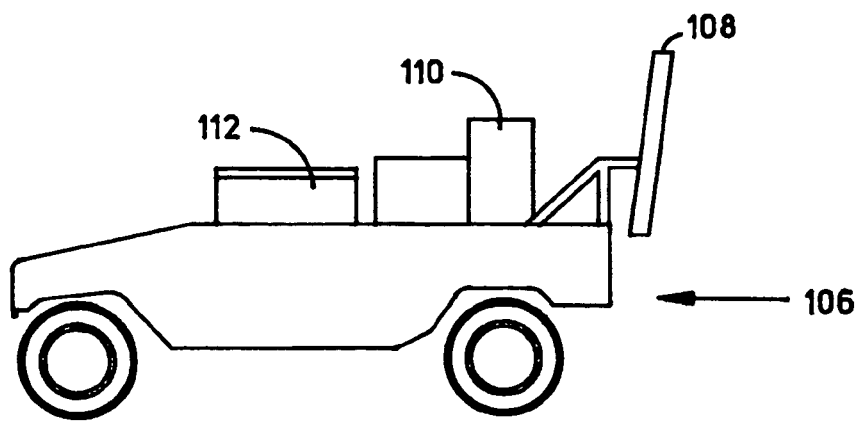
FIG. 8 is a functional block diagram illustrating an exemplary embodiment of a directed energy weapon system employing the phase-locked magnetron array of this invention.

FIG. 8 is a functional block diagram illustrating an exemplary embodiment of a directed energy weapon system 106 employing a phase-locked magnetron array 108 of this invention. As shown, directed energy weapon system 106 includes phase-locked magnetron array 108 consisting of three-hundred low-cost commercial magnetrons (20×15) and a primary power supply/conditioner 110 mounted on a vehicle 112 for mobility. The high-power microwave output from array 108 is directed along a predetermined path, in this embodiment, at targets aft of the vehicle as would be appropriate in non-combat battlefield applications. Although mobile systems of this type are limited by primary generating capacity, pulsed operation at over 1,000 kW is feasible with appropriate energy accumulators.

The magnetron array system of this invention is a robust compact structure with far less mechanical complexity than similar arrays known in the art. The advantages of the system of this invention include reduced complexity, reduced overall system size, weight, and cost and improved reliability. FIGS. 6A–7B demonstrates that a stable phase-lock is achieved over the magnetron array without power circulators, magic T's or phase-control electronics. Using eight inexpensive mass-produced commercial 1.2 kW "microwave oven" magnetron tubes, including two different models from the same manufacturer, to implement phase-locked magnetron array 64 (FIGS. 4–5), the inventors have measured output power densities equivalent to that measured from a single, and far more expensive, 20 kW magnetron tube with aperture of comparable dimension. It is an advantage of the system of this invention that it is scalable to as many magnetrons as power can be provided for. Phase-locked magnetron arrays of hundreds of cheap commercial magnetron tubes may be embodied for mobile applications using the system of this invention.

Clearly, other embodiments and modifications of this invention may occur readily to those of ordinary skill in the art in view of these teachings. Therefore, this invention is to be limited only by the following claims, which include all such embodiments and modifications when viewed in conjunction with the above specification and accompanying drawing.

We claim:

1. A microwave power generator system comprising:
a plurality of magnetron tubes each having
an anode coupled to an output cavity, and
a primary coupling waveguide having a sidewall disposed to transfer microwave energy from the magnetron output cavity to free space to produce a radiated microwave field; and
secondary cross-coupling means disposed to redirect a portion of the microwave energy from a first magnetron tube output cavity into a second magnetron tube output cavity and to redirect a portion of the microwave energy from the second magnetron tube output cavity into the first magnetron tube output cavity.

2. The system of claim 1 wherein:
the secondary cross-coupling means includes a first reflective element disposed in the microwave field radiated from the first magnetron tube to redirect a portion of the microwave energy from the first magnetron output cavity into the second magnetron output cavity.

3. The system of claim 2 wherein:
the secondary cross-coupling means includes a second reflective element disposed in the microwave field radiated from the second magnetron tube to redirect a portion of the microwave energy from the second magnetron output cavity into the first magnetron output cavity.

4. The system of claim 1 further comprising:
a first sidewall aperture disposed in the sidewall of the primary coupling waveguide of the first magnetron tube;
a second sidewall aperture disposed in the sidewall of the primary coupling waveguide of the second magnetron tube; and
a secondary cross-coupling waveguide disposed to couple the first sidewall aperture to the second sidewall aperture.

5. The system of claim 1 wherein:
the plurality of magnetron tubes includes a plurality of standardized commercial magnetron tubes suitable for microwave oven applications.

6. A directed energy weapon system for projecting microwave energy along a predetermined path, the system comprising:
a plurality of magnetron tubes each having
an anode coupled to an output cavity, and
a primary coupling waveguide having a sidewall disposed to transfer microwave energy from the magnetron output cavity to free space to produce a radiated microwave field; and
secondary cross-coupling means disposed to redirect a portion of the microwave energy from a first magnetron tube output cavity into a second magnetron tube output cavity and to redirect a portion of the microwave energy from the second magnetron tube output cavity into the first magnetron tube output cavity.

7. The system of claim 6 wherein:
the secondary cross-coupling means includes a first reflective element disposed in the microwave field radiated from the first magnetron tube to redirect a portion of the microwave energy from the first magnetron output cavity into the second magnetron output cavity.

8. The system of claim 7 wherein:
the secondary cross-coupling means includes a second reflective element disposed in the microwave field radiated from the second magnetron tube to redirect a portion of the microwave energy from the second magnetron output cavity into the first magnetron output cavity.

9. The system of claim 6 further comprising:
a first sidewall aperture disposed in the sidewall of the primary coupling waveguide of the first magnetron tube;

a second sidewall aperture disposed in the sidewall of the primary coupling waveguide of the second magnetron tube; and a secondary cross-coupling waveguide disposed to couple the first sidewall aperture to the second sidewall aperture.

10. The system of claim 6 wherein:

the plurality of magnetron tubes includes a plurality of standardized commercial magnetron tubes suitable for microwave oven applications.

11. A microwave power generator system comprising:

a plurality of magnetron tubes each having
an anode coupled to an output cavity, and
a primary coupling waveguide having a sidewall disposed to transfer microwave energy from the magnetron output cavity to free space to produce a radiated microwave field, wherein
the magnetron tube plurality is disposed in an array having a plurality of columns and a plurality of rows; and secondary row cross-coupling means disposed between a first and a second magnetron tube within a single array column to redirect a portion of the microwave energy from the first magnetron tube output cavity into the second magnetron tube output cavity and to redirect a portion of the microwave energy from the second magnetron tube output cavity into the first magnetron tube output cavity.

12. The system of claim 11 further comprising:

secondary column cross-coupling means disposed between a third and a fourth magnetron tube within a single array row to redirect a portion of the microwave energy from a third magnetron tube output cavity into a fourth magnetron tube output cavity and to redirect a portion of the microwave energy from the fourth magnetron tube output cavity into the third magnetron tube output cavity.

13. The system of claim 12 wherein:

the secondary column cross-coupling means includes
a first reflective element disposed in the microwave field radiated from the third magnetron tube to redirect a portion of the microwave energy from the third magnetron output cavity into the fourth magnetron output cavity.

14. The system of claim 13 wherein:

the secondary column cross-coupling means includes
a second reflective element disposed in the microwave field radiated from the fourth magnetron tube to redirect a portion of the microwave energy from the fourth magnetron output cavity into the third magnetron output cavity.

15. The system of claim 11 wherein:

the secondary row cross-coupling means includes
a first sidewall aperture disposed in the sidewall of the primary coupling waveguide of the first magnetron tube,
a second sidewall aperture disposed in the sidewall of the primary coupling waveguide of the second magnetron tube, and
a secondary cross-coupling waveguide disposed to couple the first sidewall aperture to the second sidewall aperture.

16. The system of claim 11 wherein:

the plurality of magnetron tubes includes a plurality of standardized commercial magnetron tubes suitable for microwave oven applications.

17. A directed energy weapon system for projecting microwave energy along a predetermined path, the system comprising:

a plurality of magnetron tubes each having
an anode coupled to an output cavity, and
a primary coupling waveguide having a sidewall disposed to transfer microwave energy from the magnetron output cavity to free space to produce a radiated microwave field, wherein
the magnetron tube plurality is disposed in an array having a plurality of columns and a plurality of rows; and secondary row cross-coupling means disposed between a first and a second magnetron tube within a single array column to redirect a portion of the microwave energy from the first magnetron tube output cavity into the second magnetron tube output cavity and to redirect a portion of the microwave energy from the second magnetron tube output cavity into the first magnetron tube output cavity.

18. The system of claim 17 further comprising:

secondary column cross-coupling means disposed between a third and a fourth magnetron tube within a single array row to redirect a portion of the microwave energy from a third magnetron tube output cavity into a fourth magnetron tube output cavity and to redirect a portion of the microwave energy from the fourth magnetron tube output cavity into the third magnetron tube output cavity.

19. The system of claim 18 wherein:

the secondary column cross-coupling means includes
a first reflective element disposed in the microwave field radiated from the third magnetron tube to redirect a portion of the microwave energy from the third magnetron output cavity into the fourth magnetron output cavity.

20. The system of claim 19 wherein:

the secondary column cross-coupling means includes
a second reflective element disposed in the microwave field radiated from the fourth magnetron tube to redirect a portion of the microwave energy from the fourth magnetron output cavity into the third magnetron output cavity.

21. The system of claim 17 wherein:

the secondary row cross-coupling means includes
a first sidewall aperture disposed in the sidewall of the primary coupling waveguide of the first magnetron tube,
a second sidewall aperture disposed in the sidewall of the primary coupling waveguide of the second magnetron tube, and
a secondary cross-coupling waveguide disposed to couple the first sidewall aperture to the second sidewall aperture.

22. The system of claim 17 wherein:

the plurality of magnetron tubes includes a plurality of standardized commercial magnetron tubes suitable for microwave oven applications.

* * * * *